(12) United States Patent
Kitagawa et al.

(10) Patent No.: US 8,218,355 B2
(45) Date of Patent: Jul. 10, 2012

(54) MAGNETORESISTIVE ELEMENT AND MAGNETIC MEMORY

(75) Inventors: Eiji Kitagawa, Yokohama (JP); Masatoshi Yoshikawa, Yokohama (JP); Toshihiko Nagase, Sagamihara (JP); Tadaomi Daibou, Kawasaki (JP); Makoto Nagamine, Komae (JP); Katsuya Nishiyama, Yokohama (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 475 days.

(21) Appl. No.: 12/409,716

(22) Filed: Mar. 24, 2009

(65) Prior Publication Data

US 2009/0243008 A1 Oct. 1, 2009

(30) Foreign Application Priority Data

Mar. 27, 2008 (JP) ................. 2008-084938

(51) Int. Cl.
*G11C 11/14* (2006.01)
(52) U.S. Cl. .. 365/158; 365/171; 257/421; 257/E21.665
(58) Field of Classification Search .................. 365/158, 365/171, 173; 257/421, E21.665; 360/324.11, 360/324.12; 977/934, 935
See application file for complete search history.

(56) References Cited

U.S. PATENT DOCUMENTS

| | | | |
|---|---|---|---|
| 6,256,223 B1 | 7/2001 | Sun | |
| 7,518,906 B2 | 4/2009 | Ikegawa et al. | |
| 7,663,197 B2 * | 2/2010 | Nagase et al. | 257/421 |
| 2007/0086121 A1 * | 4/2007 | Nagase et al. | 360/324.1 |
| 2007/0096229 A1 * | 5/2007 | Yoshikawa et al. | 257/421 |
| 2008/0088980 A1 * | 4/2008 | Kitagawa et al. | 360/313 |
| 2008/0291585 A1 | 11/2008 | Yoshikawa et al. | |
| 2009/0080124 A1 | 3/2009 | Yoshikawa et al. | |
| 2009/0080238 A1 | 3/2009 | Yoshikawa et al. | |

FOREIGN PATENT DOCUMENTS

| | | |
|---|---|---|
| JP | 2001-189010 | 7/2001 |
| JP | 2007-142364 | 6/2007 |
| KR | 10-2007-0042891 | 4/2007 |

OTHER PUBLICATIONS

Korean Office Action issued Oct. 25, 2010, in Patent Application No. 10-2009-0024532 (with English-language translation).
Tomoyuki Maeda, "Fabrication of Highly (001) Oriented $L1_0$FePt Thin Film Using NiTa Seed Layer", IEEE Transactions on Magnetics, vol. 41, No. 10, Oct. 2005, pp. 3331-3333.
Toshio Suzuki, et al., "Preparation of ordered Fe—Pt thin films for perpendicular magnetic recording media", Journal of Magnetism and Magnetic Materials 193 (1999), pp. 85-88.
U.S. Appl. No. 12/409,654, filed Mar. 24, 2009, Yoshikawa, et al.
U.S. Appl. No. 12/407,786, filed May 22, 2009, Nagamine, et al.

* cited by examiner

*Primary Examiner* — Douglas King
(74) *Attorney, Agent, or Firm* — Oblon, Spivak, McClelland, Maier & Neustadt, L.L.P.

(57) ABSTRACT

A magnetoresistive element includes an underlying layer having a cubic or tetragonal crystal structure oriented in a (001) plane, a first magnetic layer provided on the underlying layer, having perpendicular magnetic anisotropy, and having an fct structure oriented in a (001) plane, a non-magnetic layer provided on the first magnetic layer, and a second magnetic layer provided on the non-magnetic layer, and having perpendicular magnetic anisotropy. An in-plane lattice constant a1 of the underlying layer and an in-plane lattice constant a2 of the first magnetic layer satisfy the following equation in which b is a magnitude of Burgers vector of the first magnetic layer, ν is an elastic modulus of the first magnetic layer, and hc is a thickness of the first magnetic layer.

$$|\sqrt{2} \times a1/2 - a2|/a2 < b \times \{\ln(hc/b)+1\}/\{2\pi \times hc \times (1+\nu)\}.$$

25 Claims, 11 Drawing Sheets

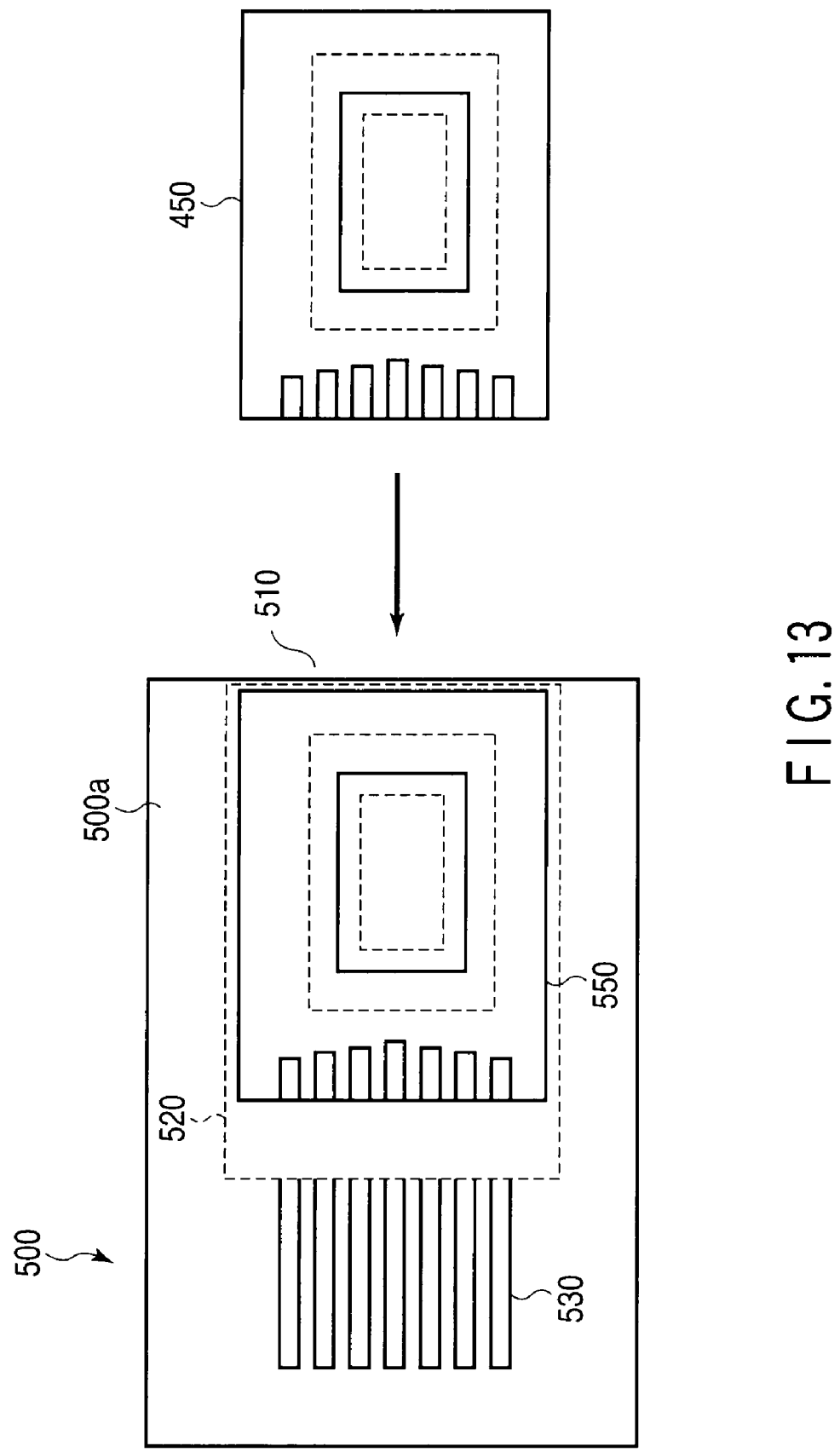
F I G. 13

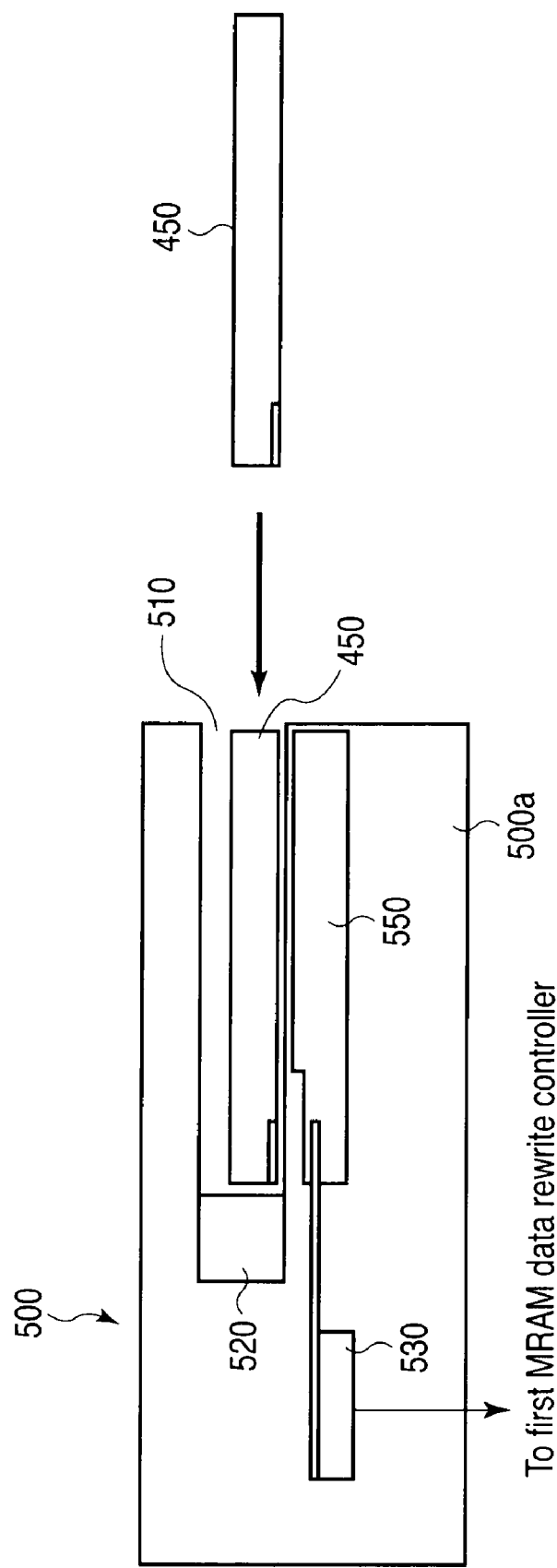
F I G. 14

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2008-084938, filed Mar. 27, 2008, the entire contents of which are incorporated herein by reference.

BACKGROUND OF THE INVENTION

1. Field of the Invention

The present invention relates to a magnetoresistive element and a magnetic memory. For example, the present invention relates to a magnetoresistive element which can store information by bidirectionally supplying a current thereto.

2. Description of the Related Art

A magnetic random access memory (MRAM) using a ferromagnetic material is anticipated as a nonvolatile memory having non-volatility, high-speed operation, large capacity and low power consumption. The MRAM includes a magnetic tunnel junction (MTJ) element using a tunneling magnetoresistive (TMR) effect as a memory element. The MRAM stores information according to the magnetization configuration of the MTJ element.

A conventional MRAM executing a write operation using a magnetic field by an interconnect current has the following problem. With the advance in scale reduction, a current flowing through the interconnect decreases; for this reason, it is difficult to supply a sufficient current magnetic field to the MTJ element. In addition, the size of the current magnetic field required for recording information to the MTJ element increases resulting from the scale reduction of the MTJ element. Thus, for the 126 to 256 M-bit generation, there is a theoretical limit in the in the execution of a write operation using a magnetic field by an interconnect current in an MRAM.

In order to solve the foregoing problem, an MRAM executing a write operation using spin momentum transfer (SMT) has been proposed (Document 1: U.S. Pat. No. 6,256,223). Magnetization switching by the spin momentum transfer (also referred to as spin injection) has the following advantage. Specifically, even if scale reduction of the element is made, the magnitude of current density required for magnetization switching does not increase; therefore, a high-effective write operation is possible.

BRIEF SUMMARY OF THE INVENTION

According to an aspect of the present invention, there is provided a magnetoresistive element comprising: a first underlying layer having a cubic or tetragonal crystal structure oriented in a (001) plane; a first magnetic layer provided on the first underlying layer, having magnetic anisotropy perpendicular to a film surface, and having a face-centered tetragonal (fct) structure oriented in a (001) plane; a first non-magnetic layer provided on the first magnetic layer; and a second magnetic layer provided on the first non-magnetic layer, and having magnetic anisotropy perpendicular to a film surface. An in-plane lattice constant a1 of the first underlying layer and an in-plane lattice constant a2 of the first magnetic layer satisfy the following equation in which b is a magnitude of Burgers vector of the first magnetic layer, ν is an elastic modulus of the first magnetic layer, and hc is a thickness of the first magnetic layer.

$$|\sqrt{2} \times a1/2 - a2|/a2 < b \times \{\ln(hc/b) + 1\} / \{2\pi \times hc \times (1+\nu)\}$$

According to an aspect of the present invention, there is provided a magnetoresistive element comprising: a first underlying layer having a perovskite structure oriented in a (001) plane; a first magnetic layer provided on the first underlying layer, and having magnetic anisotropy perpendicular to a film surface, and having an fct structure oriented in a (001) plane; a first non-magnetic layer provided on the first magnetic layer; and a second magnetic layer provided on the first non-magnetic layer, and having magnetic anisotropy perpendicular to a film surface. An in-plane lattice constant a1 of the first underlying layer and an in-plane lattice constant a2 of the first magnetic layer satisfy the following equation in which b is a magnitude of Burgers vector of the first magnetic layer, ν is an elastic modulus of the first magnetic layer, and hc is a thickness of the first magnetic layer.

$$|a1 - a2|/a2 < b \times \{\ln(hc/b) + 1\} / \{2\pi \times hc \times (1+\nu)\}$$

According to an aspect of the present invention, there is provided a magnetic memory comprising a memory cell including the magnetoresistive element, and first and second electrodes sandwiching the magnetoresistive element to supply a current to the magnetoresistive element.

BRIEF DESCRIPTION OF THE SEVERAL VIEWS OF THE DRAWING

FIG. 13 is a plan view showing a transfer apparatus 500 for transferring data to an MRAM card;

FIG. 14 is a cross-sectional view showing a transfer apparatus 500 for transferring data to an MRAM card;

DETAILED DESCRIPTION OF THE INVENTION

Figure 1:
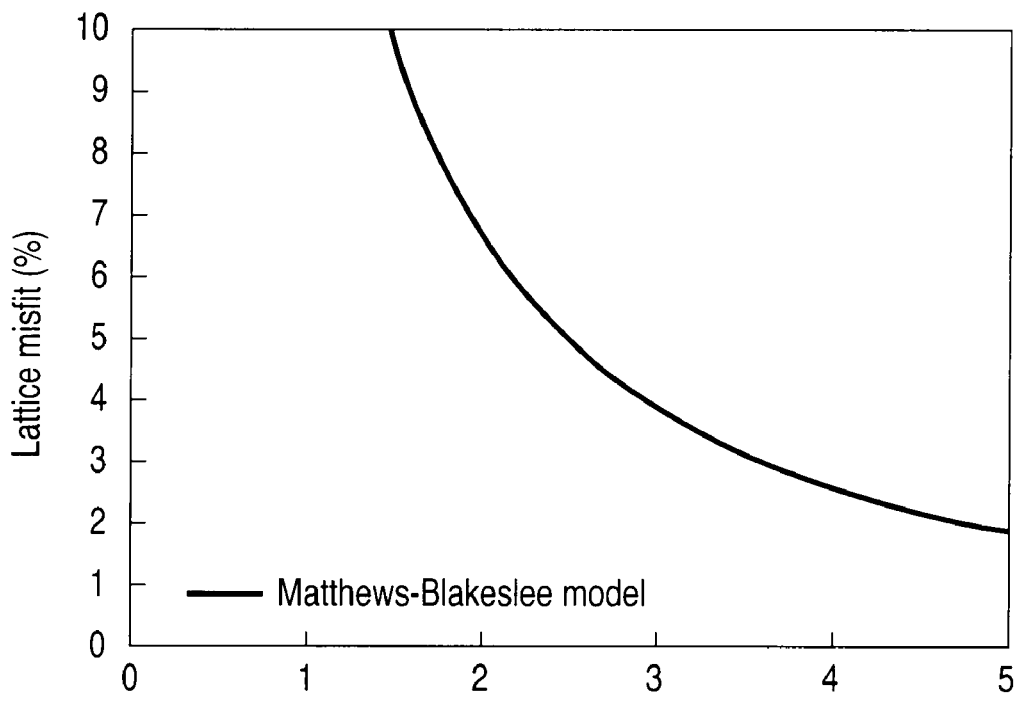
FIG. 1 is a graph illustrating the relationship between a lattice misfit and a critical thickness of a recording layer.

In order to achieve an MRAM of a large capacity, a ferromagnetic layer forming an MTJ element must be scaled down to be integrated at the cell-size level. For example, according to a design of an MRAM having a 1 G-bit memory capacity, a cell size of less than 100 nm is anticipated. Scale reduction is further required to achieve a higher capacity than above. If the size of the ferromagnetic layer is reduced, the ferromagnetic layer receives an influence of thermal vibration due to a thermal fluctuation magnetic aftereffect. As a result, the magnetization direction of the ferromagnetic layer freely changes. The influence of such thermal fluctuation magnetic aftereffect will be described hereinafter giving a single domain particle having uniaxial magnetic anisotropy as an example.

A magnetic anisotropy energy U is expressed as U=KuV when a magnetic anisotropy energy density is Ku and the volume of a ferromagnetic layer is V. An atom has thermal vibration energy KBT; for this reason, if the thermal vibration energy becomes larger than the magnetic anisotropy energy, magnetization switching occurs easily. Namely, if KuV<KBT (or KuV/KBT<1) occurs, the magnetization of the ferromagnetic layer has a paramagnetic behavior. The layer becomes a paramagnetic material, the ferromagnetic layer does not hold magnetization in one direction; as a result, the ferromagnetic layer does not exhibit a function as a memory element. Thus, the ferromagnetic layer needs to satisfy the condition of KuV/KBT>1 at minimum.

The ferromagnetic layer used for a memory element must hold magnetized information for several years. The foregoing condition of KuV/KBT>1 does not include time information. Thus, for example, in a 1 G-bit memory cell, the probability of a magnetization direction switch of 1 bit must be considered. In this case, the ferromagnetic layer is required to satisfy the condition of KuV/KBT>60.

The magnetic anisotropy energy U is directly proportional to the product of the magnetic anisotropy energy density Ku and the value of the ferromagnetic layer. As the cell size decreases, the volume V of the ferromagnetic layer decreases. The foregoing condition of KuV/KBT>60 must be satisfied in order to store nonvolatile information in the MTJ element. For this reason, there is a need of raising the magnetic anisotropy energy density Ku to compensate for a decrease in the volume V. If the film thickness of the ferromagnetic layer is 3 nm, when the cell size is 100 nm, the value of Ku needs to be higher than $1 \times 10^5$ erg/cc. Further, when the cell size is 40 nm, the value of Ku needs to be higher than $6 \times 10^5$ erg/cc.

The following two methods are studied as a method of securing the magnetic anisotropy energy of the ferromagnetic layer. One is a method of using magnetic shape anisotropy energy, and the other is a method of using magnetocrystalline anisotropy energy. It is known that the magnetic shape anisotropy energy is proportional to a planar shape, film thickness and element width. In a cell size of 40 nm or less, if the magnetic anisotropy energy of the ferromagnetic layer is secured using magnetic shape anisotropy, a design is made so that the planar shape is made thin long plane, a design is made to thicken the element.

If the thickness of the ferromagnetic layer is fixed at 3 nm and the magnetic anisotropy energy is secured by only using the planar shape, the aspect ratio is 3 or more. For this reason, it is difficult to achieve scale reduction and a high capacity MRAM. The planar shape of the ferromagnetic layer is fixed to an ellipse having an aspect ratio of 2, and the film thickness is thickened to secure the magnetic anisotropy energy. In this case, the film thickness needs to be 4 nm or more. However, the thickness of the ferromagnetic layer increases, and thereby, this is a factor for having to increase the spin injection current. For this reason, it is difficult to compensate the magnetic anisotropy energy of the micro ferromagnetic layer of several tens of nm or less using magnetic shape anisotropy.

On the other hand, the magnetic anisotropy energy of the ferromagnetic layer is secured using magnetocrystalline anisotropy energy. In this case, magnetocrystalline anisotropy occurs from the crystal symmetry. For this reason, a plurality of axes other than uniaxial magnetic anisotropy has anisotropy as to the difference of a crystal structure. If binary value (1 bit) information is given to the ferromagnetic layer, preferably, the magnetization direction has two directions, that is, 0° (assumed as value "1") and 180° (assumed as value "0") in a stable state. However, when two or more directions of easy magnetization of the magnetocrystalline anisotropy exist, magnetization has three or more stable states. If three or more magnetization directions capable of being switched by spin injection exist, value "1" and value "0" information are not accurately stored; therefore, this is not preferable.

Namely, if the magnetic anisotropy energy is secured using magnetocrystalline anisotropy, a material having uniaxial magnetic anisotropy must be used as the ferromagnetic layer. If an in-plane magnetization ferromagnetic layer has uniaxial magnetic anisotropy, for example, a CoCr alloy such as is used for a hard disk medium may be used as a material having a high magnetocrystalline anisotropy energy density. In such a CoCr alloy, the crystal axis largely disperses in the in-plane direction; for this reason, magnetic resistance (MR) is reduced. In addition, incoherent precession is induced; as a result, the magnetization switching current of the MTJ element increases.

If the crystal axis is made to be perpendicular to the film surface, the crystal axis can only be the z-axis; therefore, the dispersion of the crystal axis can be prevented. The following methods are available to enable such crystal axis to be perpendicular to the z direction. One is a method of stacking different material films, and using anisotropy induced on the interface between the stacked films. Another is a method of growing a hexagonal crystal structure in a [001] direction to the film surface, and using magnetocrystalline anisotropy induced from crystal symmetry. A further method involves changing the size of a crystal lattice in the in-plane direction and the perpendicular direction. Another method uses magnetostriction.

Of materials having perpendicular magnetic anisotropy, the following are given as alloys having high magnetocrystalline anisotropy. Examples are an FePT ordered alloy having an $L1_0$-type crystal structure grown in a [001] direction to an in-plane direction, an FePd ordered alloy, a CoPt ordered alloy or NiPt ordered alloy are given. For example, the FePd ordered alloy has a magnetocrystalline anisotropy of $2.6 \times 10^7$ erg/cc. Assuming that an MTJ element has a magnetocrystalline anisotropy of $2.6 \times 10^7$ erg/cc, a saturation magnetization of 1000 emu/cc and a thickness of 2 nm, a scale reduction of the MTJ element to about 10 nm is possible.

But, if the thin FePd film is deposited using vapor rapid quenching such as sputtering, the FePd film does not pass through a thermodynamic disorder-order transformation point existing in a solid phase. For this reason, a metastable face-centered cubic (fcc) irregular phase (A1 phase) is formed after deposition. Lattice diffusion of atoms is required to transform the metastable A1 phase into $L1_0$ ordered phase. Thus, heat treatment at 500° C., which is equivalent to half the melting point of the FePd alloy, is required.

However, the MTJ element is formed on a MOS transistor and front ends of line (FEOL) interconnect. For this reason, considering damage to the foregoing MOS transistor and FEOL interconnect, it is difficult to carry out high-temperature heat treatment. Due to the foregoing reason, the A1 Phase needs to be regularized to an $L1_0$ structure by a low-temperature heat treatment.

Heat deposition is given as one of the methods of forming the $L1_0$ structure at low temperature. According to such heat deposition, an FePd film is formed using sputtering while a substrate is heated. The energy of the sputtering particles is added to the thermal energy from the substrate as the energy necessary for forming the $L1_0$ structure. Thus, it is possible to form an ordered layer having a high-quality $L1_0$ structure at a low temperature, from 300 to 450° C.

An $L1_0$ structure film oriented in a [001] direction to the in-plane direction is grown using the heat deposition method given above. In order to grow the $L1_0$ structure film, the crystal orientation must be controlled from an underlying layer. Some reports have been made in the magnetic medium field as regards this underlying layer, for example, document 2 (T. Maeda, IEEE trans. Mag., vol. 41, 2005, pp. 3331-3333). According to document 2, Pt 20 nm/Cr 5 nm/NiTa 25 nm is disclosed as the FePT underlying layer having the $L1_0$ structure. In the foregoing stacking film, the left side of a symbol "/" is an upper layer, and the right side thereof is a lower layer. The document 3 (e.g., see JP-A 2001-189010 (KOKAI)) discloses an oxide, nitride or carbide having an NaCl structure. Document 4 (T. Suzuki et al., J. Magn. Mater., 193 (1999) 85-88) discloses Cr 7 nm/MgO 10 nm as the underlying layer.

The following underlying layers are not preferable in order to realize magnetization switching by spin-polarized current. For example, an underlying layer having high resistance. The following underlying layer is not preferable as an underlying layer neighboring a recording layer. Specifically, the underlying layer includes an element having the following features. Because of such features, the magnetic anisotropy energy, barrier resistance or electric characteristics such as an MR ratio are remarkably reduced by the diffusion generated in a heat process required for order, FEOL or back end of line (BEOL). Considering such circumstances, it is not preferable to use the underlying layer disclosed in the foregoing publicknown document. This is because, according to the foregoing document 2, Cr, which remarkably reduces the MR ratio, is used. According to the foregoing document 4, MgO having a high resistance is formed thick; for this reason, the resistance of the MTJ element becomes remarkably high, and thus, a current is not carried. Namely, the underlying layer needs to satisfy the following characteristics when an ordered alloy having the $L1_0$ structure is used as a recording layer employing spin injection magnetization switching.

Low electric resistance
High heat resistance
Low lattice mismatch
Crystal orientation (oriented in [001] direction to in-plane direction)

If a metal is used as the underlying layer, diffusion occurs due to the heat process; for this reason, a metal is not preferable due to its heat resistance. Preferably, ionic-bonded and covalent-bonded compounds are used as the underlying layer because diffusion by the heat process does not occur. MgO is a compound, but it is not preferable because it has high resistance. In the foregoing document 3, CrN, which has a low heat resistance and low electric resistance, is used. However, CrN is not preferable because the lattice mismatch is about 8% with respect to the FePd recording layer. This results from the following reason. If the lattice mismatch is high between a material used as a recording layer and a material used as an underlying layer, dislocation comes into the recording layer in a crystal growth stage. As a result, the orientation of the recording layer is reduced. This is because the magnetic characteristics of the recording layer having the $L1_0$ structure are not uniform.

In order to obtain a recording layer having a high-quality $L1_0$ structure using heat deposition, there is a need of selecting an underlying layer having high lattice matching. In addition, there is a need of selecting an underlying layer having excellent heat resistance for preventing atomic diffusion from the underlying layer.

Here, a lattice constant of the underlying layer is a1, a lattice constant of an in-plane direction of the recording layer is a2, and the magnitude of Burgers vector of the recording layer is b. Further, an elastic constant of the recording layer is v, and a film thickness thereof is hc. According to Matthews-Blakeslee model, the following equation (1) is given between the lattice misfit of the underlying layer and the recording layer and a critical thickness for preventing a dislocation from affecting the recording layer.

$$|a1-a2|/a2 < b \times \{\ln(hc/b)+1\}/\{2\pi \times hc \times (1+v)\} \qquad (1)$$

FIG. 1 is a graph to explain the relationship between a lattice misfit of the underlying layer and the recording layer and a critical film thickness generating a dislocation defect when FePd is used as the recording layer. In order to lead the foregoing equation, b=0.268 nm and v=0.343 are used. The foregoing equation (1) expresses a lower area of the curve of FIG. 1. As seen from FIG. 1, if the thickness of the recording layer is given, the magnitude of the lattice misfit of the underlying layer and the recording layer for preventing a dislocation from affecting the recording layer is given.

The film thickness of the recording layer is determined from the relationship between spin injection efficiency and heat disturbance resistance. For example, if the recording layer becomes thick, the magnetization switching current due to spin injection increases. For this reason, the film thickness should not be greatly increased. Also, if the recording layer becomes too thin, the heat disturbance resistance is reduced; for this reason, there is a limit to the thinness of the film. Empirically, the thickness of the recording layer should be designed in a range from 1.5 to 4 nm. For example, if the thickness of the recording layer is 3 nm, as seen from FIG. 1, the lattice misfit of the underlying layer and the recording layer is designed to 4% or less as a condition that dislocation dose not comes into the recording layer. If FePd having the $L1_0$ structure is used as the recording layer, a required lattice constant of the underlying layer is determined. Namely, when FePd having the $L1_0$ structure is used as the recording layer, there is a need of selecting a material as the underlying layer having the lattice misfit of 4% or less with respect to the recording layer.

Based on the foregoing knowledge, various embodiments of the present invention will be hereinafter described with reference to the accompanying drawings. In the following description, the same reference numerals are used to designate elements having the same function and configuration, and an overlapping explanation is made only if necessary.

First Embodiment

[1] The Structure of MTJ Element

Figure 2:
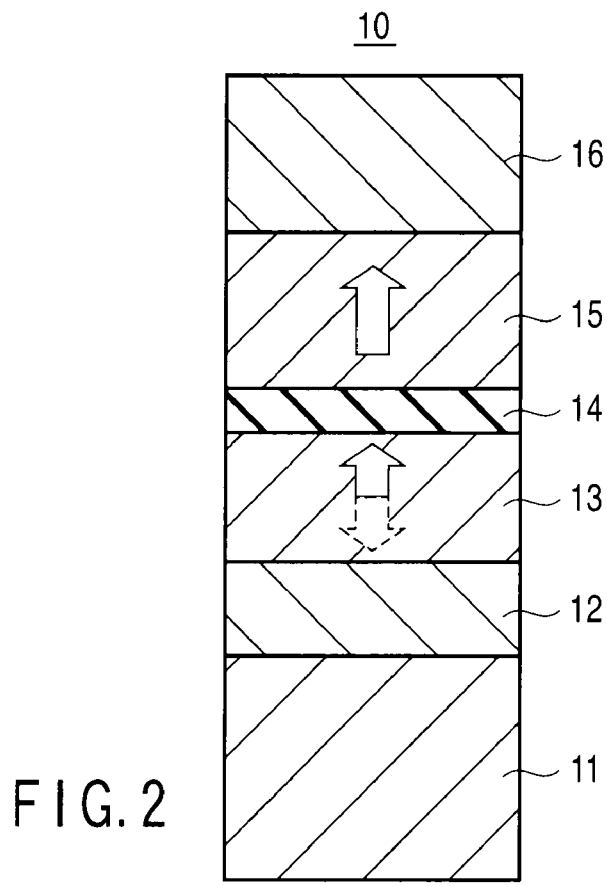
FIG. 2 is a cross-sectional view showing the structure of an MTJ element 10 according to a first embodiment.

FIG. 2 is a cross-sectional view showing the structure of an MTJ element according to a first embodiment of the present invention. In FIG. 2, arrows denote the magnetization directions. According to this embodiment, an MTJ element 10 having a single pinned layer structure (i.e., structure in which one recording layer and one reference layer are stacked via a non-magnetic layer) will be described below as an example.

The MTJ element 10 has a stacked structure having the following layers successively stacked. The layers are a crystal orientation underlying layer 12, a recording layer (also called a free layer) 13, a tunnel barrier layer (non-magnetic layer) 14 and a reference layer (also called a pinning layer). Further, the bottom surface of the crystal orientation underlying layer 12 is provided with a bottom electrode 11, and the upper surface of the reference layer 15 is provided with a top electrode 16. For example, tantalum (Ta) is used as the foregoing bottom and top electrodes. Incidentally, the crystal orientation underlying layer 12 may be used as one layer functioning as the bottom electrode 11.

The magnetization (or spin) direction of the recording layer 13 is variable (switched). The magnetization direction of the reference layer 15 is invariable (pinning). The foregoing description "The magnetization direction of the reference layer 15 is invariable" means that when a magnetization switching current used for switching the magnetization direction of the recording layer 13 is carried to the reference layer 15, the magnetization direction of the reference layer 15 has no change. Thus, in the MTJ element 10, a magnetic layer having a large switching current is used as the reference layer 15, and a magnetic layer having a switching current smaller than the reference layer is used as the recording layer 13. In this way, it is possible to realize an MTJ element 10 including the recording layer 13 having a variable magnetization and the reference layer having an invariable magnetization. If magnetization switching is obtained using spin-polarized electrons, the switching current is proportional to an attenuation constant, anisotropic magnetic field and volume. Thus, the foregoing parameters are properly controlled to obtain the difference in the switching current between the recording layer 13 and the reference layer 15.

The reference layer 15 and the recording layer 13 each have magnetic anisotropy in a direction perpendicular to the film surface. The direction of easy magnetization of the reference layer 15 and the recording layer 13 is perpendicular to the film surface (or stacked surface) (hereinafter, referred to as perpendicular magnetization). In other words, the MTJ element is a so-called perpendicular magnetization type MTJ element such that the magnetization direction of the reference layer 15 and the recording layer 13 each points in a direction perpendicular to the film surface. Incidentally, the direction of easy magnetization means the following direction. Specifically, if a macro-size ferromagnetic material is presumed, when spontaneous magnetization points in the foregoing direction in a state that an external field does not exist, the internal energy is at the minimum. The direction of hard magnetization means the following direction. Specifically, if a macro-size ferromagnetic material is presumed, when spontaneous magnetization points in the foregoing direction in a state that an external field does not exist, the internal energy is at the maximum.

In the MTJ element 10 having the foregoing structure, an information write operation is carried out in the following manner. First, bidirectional current conduction is made with respect to the MTJ element 10 in a direction perpendicular to the film surface (stacked surface).

When electrons (i.e., electrons from the reference layer 15 toward the recording layer 13) are supplied from the reference layer 13, spin-polarized electrons in the same direction as the magnetization direction of the reference layer 15 are injected to the recording layer 13. In this case, the magnetization direction of the recording layer 13 is arranged to be the same as that of the reference layer 15. In this way, the magnetization directions of the reference and recording layers 15 and 13 are arranged in parallel. In the foregoing parallel arrangement, the resistance value of the MTJ element 10 becomes the minimum, and this case relates to data "0".

Conversely, when electrons are supplied from the recording layer 13 (i.e., from the recording layer 13 toward the reference layer 15), the electrons are reflected by the reference layer 15. Thus, spin-polarized electrons in a direction opposite to the magnetization direction of the reference layer 15 are injected to the recording layer 13. In this case, the magnetization direction of the recording layer 13 is made to be opposite to the magnetization direction of the reference layer 15. In this way, the magnetization directions of the reference and recording layers 15 and 13 are arranged in anti-parallel. In the foregoing anti-parallel arrangement, the resistance value of the MTJ element 10 becomes the maximum, and this case relates to data "1".

A data read operation is carried out by supplying a read current to the MTJ element 10. The read current is set smaller than the write current. The resistance value of the MTJ element 10 varies according to whether the magnetization direction between the reference layer 15 and the recording layer is parallel or anti-parallel. A change of the resistance value is detected based on the read current.

[2] The Structure of Recording Layer 13, Reference Layer 15 and Tunnel Barrier Layer 14

The following magnetic material is used as the recording layer 13 and the reference layer realizing perpendicular magnetization. The magnetic material has a basic structure, that is, an $L1_0$ structure, which is a face-centered tetragonal (fct) structure oriented in a (001) plane with respect to an in-plane direction, or an $L1_2$ structure. In order to realize perpendicular magnetization by the recording layer 13 and the reference layer 15, preferably, a material having a magnetocrystalline anisotropy energy of $5 \times 10^5$ erg/cc or more is used.

The following an ordered alloy may be used as the magnetic material of the recording layer 13 and the reference layer 15. The ordered alloy contains one or more elements of iron (Fe), cobalt (Co), nickel (Ni) and manganese (Mn) and one or more elements of platinum (Pt), palladium (Pd), rhodium (Rh), gold (Au) and aluminum (Al), and its crystal structure is the $L1_0$ structure.

Examples of ordered alloys are $Fe_{50}Pt_{50}$, $Fe_{50}Pd_{50}$, $Co_{50}Pt_{50}$, $Co_{50}Pd_{50}$, $Fe_{30}Ni_{20}Pt_{50}$, $Co_{30}Fe_{20}Pt_{50}$, $Co_{30}Ni_{20}Pt_{50}$, and $Mn_{50}Al_{50}$. Further, $Fe_{50}Ni_{50}$ may be used as the ordered alloy whose crystal structure is the $L1_0$ structure. The composition ratio of these ordered alloys is only an example, and the present invention is not limited to the foregoing composition ratio. Incidentally, the magnetic anisotropy energy density and saturation magnetization can be made lower by adding the following single impurity elements or their alloys or isolator to the foregoing ordered alloys. The single impurity elements includes copper (Cu), zinc (Zn), silver (Ag), nickel (Ni), cobalt (Co), iron (Fe), manganese (Mn), chromium (Cr), vanadium (V), titanium (Ti) and osmium (Os). Moreover, the composition ratio is controlled, and thereby, a mixed layer of the $L1_0$ structure ordered alloy and the $L1_2$ structure ordered alloy may be used.

The reference layer 15 needs to satisfy any one or more of the following conditions. One condition is such that the reference layer 15 has an anisotropy magnetic field larger than the recording layer 13. Another condition is such that the reference layer 15 has a film thickness thicker than the recording layer 13. A further condition is such that the reference layer 15 has an attenuation constant higher than the recording layer 13. If FePd is used as the recording layer, preferably, FePt or CoPt having an attenuation constant larger than FePd or FePd is formed thicker than the recording layer 13.

Figure 3:
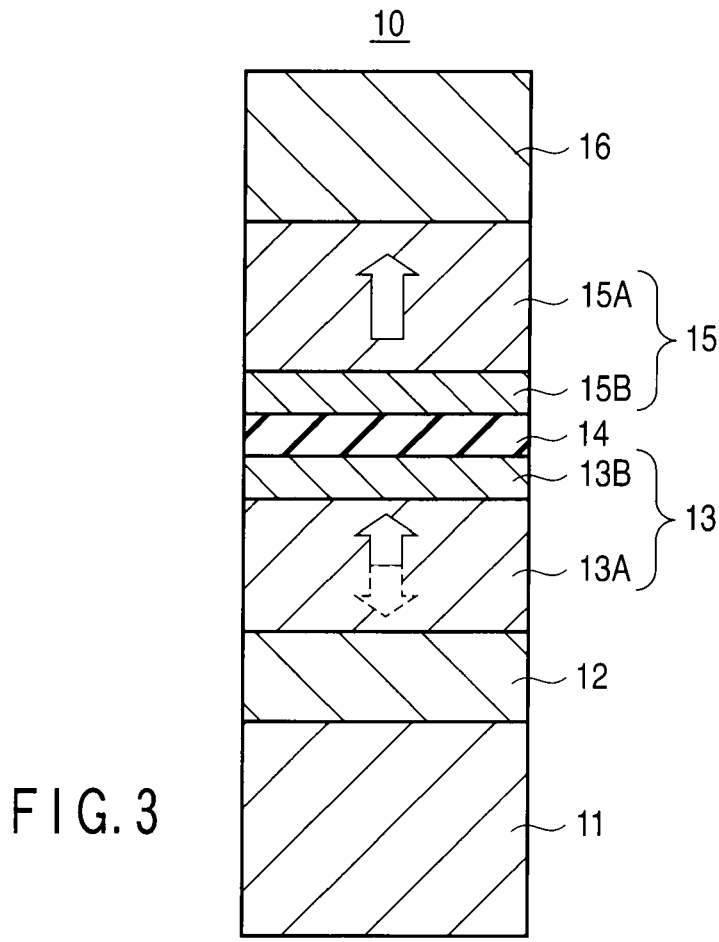
FIG. 3 is a cross-sectional view showing another structure of an MTJ element 10 according to the first embodiment.

FIG. 3 is a cross-sectional view showing another structure of an MTJ element 10. A recording layer 13 may be composed of a recording layer 13A and an interface layer 13B inserted at the interface between the recording layer 13A and a tunnel barrier layer 14. A stacked film of a FePd layer 13A having a thickness 2 nm and a CoFeB layer 13B having a thickness 0.5 nm may be used as the magnetic material forming the recording layer 13. The CoFeB layer 13B contacting the tunnel barrier layer 14 serves to improve the crystallinity of the tunnel barrier layer 14. The interface layer 13B is formed of a high-polarizability material, and thereby, the MR is improved.

Likewise, A reference layer 15 may be composed of a recording layer 15A and an interface layer 15B inserted at the interface between the reference layer 15A and a tunnel barrier layer 14. A stacked film of a FePt layer 15A having a thickness 7 nm and a CoFe layer 15B having a thickness 1 nm may be used as the magnetic material forming the reference layer 15. Further, a Pt layer may be interposed between the FePt layer 15A and the CoFe layer 15B. The Pt layer is inserted, and thereby, lattice matching in deposition is improved. Thus, this serves to improve the magnetic anisotropy energy of the reference layer 15.

If CoFeB is used as the interface layer 15B of the reference layer 15, the following materials (1) to (3) are usable as the magnetic material of the reference layer 15A.

(1) Disordered Alloy:

A metal using cobalt (Co) as a main component, and containing one or more elements of chromium (Cr), tantrum (Ta), niobium (Nb), vanadium (V), tungsten (W), hafnium (Hf), titanium (Ti), zirconium (Zr), platinum (Pt), palladium (Pd), iron (Fe) and nickel (Ni). Examples are a CoCr alloy, a CoPt alloy, a CoCrTa alloy, a CoCrPt alloy, a CoCrPtTa alloy and a CoCrNb alloy. These alloys increase the ratio of non-magnetic elements to control the magnetic anisotropy energy density and saturation magnetization.

(2) Artificial Lattice

A stacked film formed of the following metals alternately stacked. One is a metal containing any one or two or more elements of iron (Fe), cobalt (Co) and nickel (Ni). Another is a metal containing any one element or two or more elements of chromium (Cr), platinum (Pt), palladium (Pd), iridium (Ir), rhodium (Rh), osmium (Os), rhenium (Re), gold (Au) and copper (Cu). Examples are a Co/Pt artificial lattice, Co/Pd artificial lattice, CoCr/Pt artificial lattice, Co/ru artificial lattice, Co/Os artificial lattice, and a Co/au, Ni/Cu artificial lattice. These artificial lattices control the magnetic anisotropy energy density and saturation magnetization by adding element to the magnetic layer and by controlling a film thickness ratio of the magnetic layer and the non-magnetic layer.

(3) Ferrimagnetic Material

A ferrimagnetic material comprising an alloy of rare earth metal and transition metal. Examples is an amorphous alloy containing terbium (Tb), dysprosium (Dy) or gadolinium (Gd) and one or more transition metal elements, for example, TbFe, TbCo, TbFeCo, DyTbFeCo, and GdTbCo. These alloys control the magnetic anisotropy energy density and saturation magnetization by controlling the composition ratio.

A magnesium oxide (MgO), a barium oxide (BaO), a calcium oxide (CaO) or an aluminum Oxide, which each have an NaCl crystal structure, are used as the tunnel barrier layer 14. Therefore, the MTJ element 10 of this embodiment has a tunneling magnetoresistive (TMR) effect.

[3] The Structure of Underlying Layer 12

The underlying layer 12 is provided in order to control crystal orientation or crystallinity of the recording layer 13. The recording layer 13 needs to have an fct structure oriented in a (001) plane to express perpendicular magnetic anisotropy of the recording layer 13. In order to form the recording layer 13 having the foregoing crystal orientation, a nitride, oxide, sulfide or selenide, which each have a cubic crystal structure oriented in the (001) plane with respect to the film surface and a tetragonal structure are used as the underlying layer 12.

As described above, preferably, the lattice mismatch to the ordered alloy having the $L1_0$ structure used for the recording layer 13 is made to be less than 4%. In this case, if the orientation relationship between the recording layer 13 and the underlying layer 12 matches the recording layer (100)[110]//underlying layer (100)[100], the Matthews-Blakeslee model used for the equation (1) is inclined to 45°. The foregoing inclination is made, and thereby, the following equation (2) holds between a lattice misfit between the underlying layer 12 and the recording layer 13 and a critical thickness for preventing a dislocation from affecting the recording layer 13.

$$|\sqrt{2} \times a1/2 - a2|/a2 < b \times \{\ln(hc/b)+1\}/\{2\pi \times hc \times (1+v)\} \quad (2)$$

where, a1 is a lattice constant of underlying layer 12, a2 is a lattice constant of in-plane direction of recording layer 13, b is a magnitude of Burgers vector of a recording layer, v is an elastic constant of a recording layer, and hc is a thickness of recoding layer 13.

For example, if FePd is used as the recording layer, a nitride containing lanthanum (La) as a main component is given as the underlying layer 12 satisfying the foregoing equation (2). The nitride has a thickness of 5 nm, and also, has an NaCl structure oriented in the (001) plane) with respect to the in-plane direction. The foregoing material LaN having the NaCl structure obtains an epitaxial relationship in the orientation of FePd(100)[110]//LaN(100)[100] with respect to FePd having an $L1_0$ structure. Thus, the lattice misfit is 2.7%. The FePd matches a lattice rotated to an angle of 45° in the in-plane direction with respect to LaN.

Figure 4:
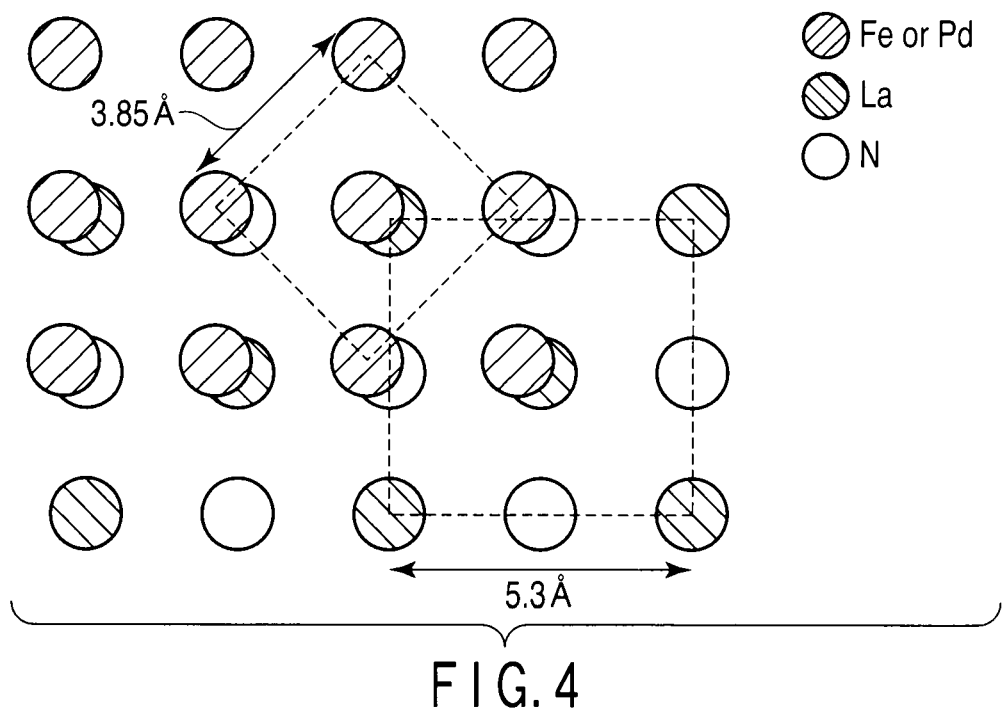
FIG. 4 is a model view to explain the crystal structure when using LaN as an underlying layer 12 and using FePd as a recording layer 13.

As described above, the LaN used as the underlying layer 12 satisfies the foregoing equation (2), and forms an FePd layer having uniform magnetic characteristics (crystal orientation) without having a dislocation defect in the film. FIG. 4 is a model view to explain the crystal structure when using LaN as the underlying layer 12 and using FePd as the recording layer 13. The lattice constant in the in-plane direction of FePd is about 3.85 Å. The lattice constant in the in-plane direction of LaN is about 5.3 Å.

As seen from FIG. 4, FePd is stacked on LaN. FePd is rotated to an angle of 45° in the in-plane direction with respect to LaN to match LaN. Thus, the lattice misfit of LaN and fePd is reduced, and therefore, an FePd layer having uniform magnetic characteristics (crystal orientation) is formed on the LaN.

The following compounds (1) to (3) may be used as the underlying layer 12 satisfying the Matthew-Blakeslee model rotated to an angle of 45°. In this case, these compounds have an NaCl structure having an in-plane direction lattice constant of about 5.25 to 5.65 Å.

(1) Oxide containing barium (Ba)

(2) Sulfide containing one or more elements of gadolinium (Gd), terbium (Tb), dysprosium (Dy), holmium (Ho), erbium (Er), and thulium (Tm)

(3) Selenide containing one or more elements of cadmium (Cd), magnesium (Mg), manganese (Mn) and erbium (Er)

In addition, the following compound (4) having a fluorite structure having an in-plane direction lattice constant of about 5.25 to 5.65 Å may be used.

(4) Oxide containing cerium (Ce) or natrium (Na)

On the other hand, the following compound is used as the material of the underlying layer 12 satisfying the foregoing equation (1) based on the Matthews-Blakeslee mode. The compound has a perovskite structure oriented in the (001) plane with respect to the in-plane direction, and also, has an in-plane lattice constant of about 3.7 to 4.0 Å. For example, an oxide containing one or more elements of strontium (Sr), dysprosium (Dy), lanthanum (La), kalium (K), cerium (Ce), lead (Pd), calcium (Ca) and barium (Ba) may be used.

When a perovskite type oxide is expressed as $ABO_3$, the foregoing "A" of $ABO_3$ includes strontium (Sr), cerium (Ce), dysprosium (Dy), lanthanum (La), kalium (K), calcium (Ca), natrium (Na), lead (Pd) or barium (Ba). The B of $ABO_3$ includes titanium (Ti), vanadium (V), chromium (Cr), manganese (Mn), iron (Fe), cobalt (Co), nickel (Ni), gallium (Ga), niobium (Nb), molybdenum (Mo), ruthenium (Ru), iridium (Ir), tantalum (Ta), cerium (Ce) or lead (Pb). In other words, $SrRuO_3$, $Sr(Ti, Ru)O_3$, $SrNbO_3$, $Sr(Ti, V)O_3$, $SrCrO_3$, $SrFeO_3$, $SrCoO_3$, $SrNbO_3$, $SrMoO_3$, $SrIrO_3$, $CeGaO_3$, $DyMnO_3$, $LaTiO_3$, $LaVO_3$, $La_{1-x}Sr_xMnO_3$, $La_{1-x}Sr_xCoO3$, $LaNiO_3$, $KTaO_3$, $PbTiO_3$, $BaMoO_3$, $CaCeO_3$, $CaCrO_3$ and $CaRuO_3$ may be used. A suitable compound is selected from these compounds considering high heat resistance, low lattice mismatch and low resistance. The perovskite type oxide can control the electric conductivity by removing the oxygen.

[3-1] The Structure 1 of Underlying Layer 12

Figure 5:
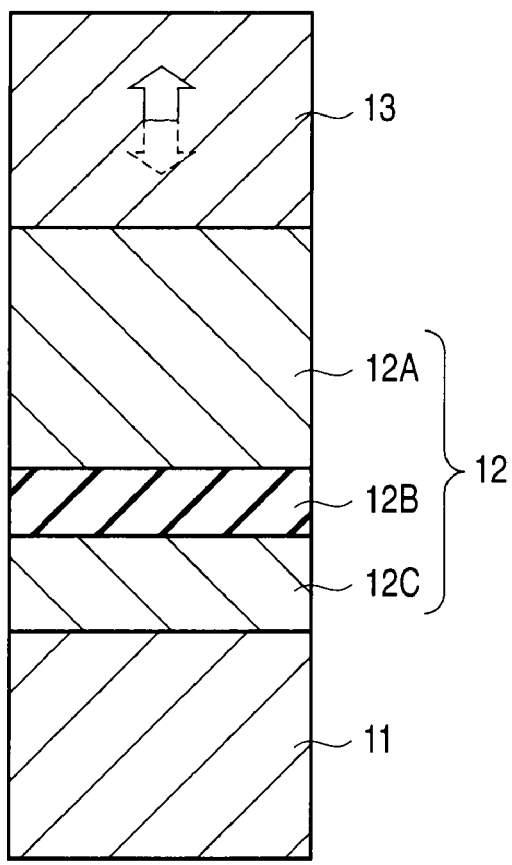
FIG. 5 is a cross-sectional view showing the structure of the underlying layer 12 according to the first embodiment.

FIG. 5 is a cross-sectional view showing the structure of the underlying layer 12. The underlying layer 12 has a stacked structure such that a second underlying layer 12C, a third underlying layer 12B and a first underlying layer 12A are successively stacked. The first underlying layer 12A is formed of the same material as the underlying layer 12 described in the foregoing item [3].

The second underlying layer 12C is provided in order to improve smoothness, crystallinity and orientation of the third underlying layer 12B (or first underlying layer 12A) thereon. A metal having an amorphous structure or microcrystal structure is used as the second underlying layer 12C. For example, a metal containing one or more the following elements, or a stacked film including the metal and an oxide of the metal, which is formed on the surface of the metal may be used as the material of the second underlying layer 12C. The elements include one or more elements of iron (Fe), cobalt (Co) and nickel, and one or more elements of boron (B), niobium (Nb), silicon (Si), tantalum (Ta) and zirconium (Zr).

The third underlying layer 12B is provided in order to improve smoothness, crystallinity and orientation of the first underlying layer 12A thereon. An oxide having an NaCl structure is used as the third underlying layer 12B. For example, an oxide containing one or more elements of magnesium (Mg), cesium (Ca), barium (Ba), titanium (Ti), vanadium (V), niobium (Nb), Manganese (Mn), iron (Fe), cobalt (Co) and nickel (Ni) as a main component may be used as the material of the third underlying layer 12B.

<Example of Underlying Layer 12>

The underlying layer 12 is formed in a manner that the following materials are successively stacked. Specifically, CoFeB having a thickness of 3 nm is used as the second underlying layer 12. MgO having a thickness of 0.5 nm is used as the third underlying layer 12B. LaN having a thickness of 5 nm may be used as the first underlying layer 12A.

[3-2] The Structure 2 of Underlying Layer 12

As seen from FIG. 5, the underlying layer 12 has a stacked structure such that a second underlying layer 12C, a third underlying layer 12B and a first underlying layer 12A are successively stacked. The first underlying layer 12A is formed of the same material as the underlying layer 12 described in the foregoing item [3].

The second underlying layer 12C is provided in order to improve smoothness, crystallinity and orientation of the third underlying layer 12B (or first underlying layer 12A) thereon. A metal having an amorphous structure or microcrystal structure is used as the second underlying layer 12C. The materials given in the item [3-1] are usable as the second underlying layer 12C.

The third underlying layer 12B is provided in order to improve smoothness and crystallinity of the third underlying layer 12A thereon and to obtain a (001) plane orientation. For example, metals such as aluminum (Al), gold (Au), palladium (Pd), platinum (Pt), silver (Ag), iron (Fe), chromium (Cr) or vanadium (V) may be used as the third underlying layer 12B.

<Example of Underlying Layer 12>

The underlying layer 12 may be formed in the following manner. NiTa having a thickness of about 10 nm is used as the second underlying layer 12C, and then, NiTa is deposited. Thereafter, the upper surface of the NiTa film is oxidized, and then, Cr having a thickness of about 10 nm is deposited on the oxidized upper surface of the NiTa film as the third underlying layer 12B. LaN having a thickness of about 5 nm is further deposited as the first underlying layer 12A.

In the underlying layer 12 having such a structure, LaN as the first underlying layer 12A can be grown on the third underlying layer 12B with a high orientation with the [001] direction with respect to the in-plane direction.

According to the embodiment described above in detail, in order to form a recording layer 13 having perpendicular magnetic anisotropy, the underlying layer 12 having an NaCl structure oriented in the (001) plane is used. The underlying layer 12 is set so that the lattice misfit becomes small with respect to the recording layer 13. In this way, it is possible to improve crystallinity, orientation of the (001) plane and smoothness of the recording layer 13. In other words, a perpendicular magnetization film whose perpendicular direction to the film surface is an axis of easy magnetization is formed as the recording layer.

In addition, it is possible to reduce any dispersion in perpendicular magnetic anisotropy of the recording layer, and thus, to reduce non-uniformity of a magnetic characteristic of the recording layer 13. This serves to improve the heat disturbance resistance (or thermal stability) of the recording layer. Further, it is possible to reduce non-uniformity of a switching current density in magnetization switching between elements.

If the underlying layer 12 of this embodiment is used, the resistance of the underlying layer 12 becomes lower. This serves to prevent a reduction in magnetic resistance ratio due to cumulative series resistance. In addition, if the underlying layer 12 having a high heat resistance is used, the heat disturbance resistance (or thermal stability) of the MTJ element 10 can be improved.

Moreover, a perpendicular magnetization film is used as the recording layer 13 and the reference layer 15. Namely, an anisotropy magnetic field required for thermally stabilizing the recording layer 13 and the reference layer 15 is obtained from crystal magnetic anisotropy. In this way, the aspect ratio of the MTJ element 10 is made small; therefore, a scale reduction of the MTJ element can be achieved.

Even if a scale reduction of the MTJ element is achieved, the switching current density does not increase. Thus, it is possible to realize a large-capacity (e.g., 256 M-bit or more) magnetic random access memory having a micro MTJ element 10 of 90 nm or less.

Second Embodiment

According to a second embodiment, a magnetic-field adjusting layer 18 is newly added, and thereby, this serves to reduce a magnetic field leaking from the reference layer 15. In this way, the shift of switching magnetic field of the reference layer 13 resulting from the leaked magnetic field is reduced or controlled.

Figure 6:
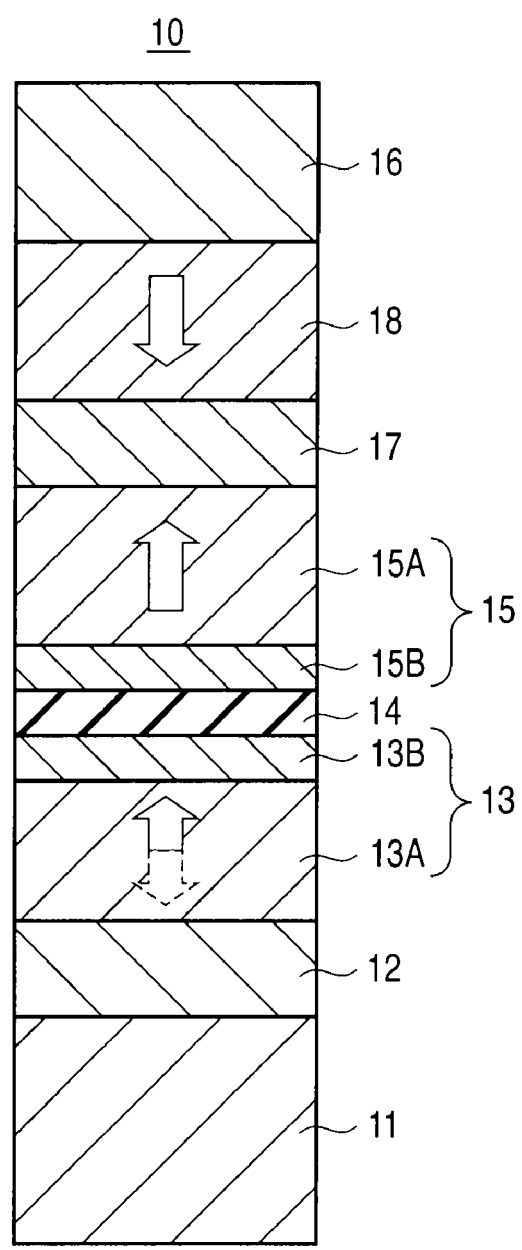
FIG. 6 is a cross-sectional view showing the structure of an MTJ element 10 according to a second embodiment.

FIG. 6 is a cross-sectional view showing the structure of an MTJ element according to a second embodiment of the present invention. The structure from the bottom electrode 11 to the reference layer 15 is the same as the first embodiment.

A non-magnetic layer 17, a magnetic-field adjusting layer 18 and a top electrode 16 are successively stacked on a reference layer 15. The magnetic-field adjusting layer 18 has an effect of reducing a magnetic field leaking from the reference layer 15. The layer 18 is further used for adjusting a shift of a switching magnetic field of the recording layer 13 due to the leaked magnetic field.

The non-magnetic layer 17 requires heat resistance for preventing the reference layer 15 from being mixed with the magnetic-field adjusting layer 18 during a heat process. The layer 17 further requires a function for controlling crystal orientation when the magnetic-field adjusting layer 18 is formed. For example, preferably, materials used as the underlying layer 12 are used as the non-magnetic layer 17. If the non-magnetic layer 17 becomes thick, a distance between the magnetic-field adjusting layer 18 and the recording layer 15 becomes long. As a result, a magnetic field applied from the magnetic-field adjusting layer 18 to the recording layer 13 becomes small. Therefore, preferably, the thickness of the non-magnetic layer 17 is set to 5 nm or less.

The magnetic-field adjusting layer 18 is formed of a magnetic material; specifically, materials used as the reference layer 15 are usable. However, the layer 18 is separated from the recording layer 13 as compared with the reference layer. For this reason, in order to correct a leaked magnetic field applied to the recording layer 13 by the layer 18, the thickness or saturation magnetization of the layer 18 must be made larger than the reference layer 15. For example, if FePtNi having a saturation magnetization of about 700 emu/cc and a thickness of about 7 nm is used as the reference layer 15, FePt having saturation magnetization of about 1000 emu/cc and a thickness of about 15 nm is usable as the magnetic-field adjusting layer 18.

The magnetization direction of the magnetic-field adjusting layer 18 is set in anti-parallel with that of the reference layer 15. Thus, a coercive force Hc1 of the reference layer 15 and a coercive force Hc2 of the magnetic-field adjusting layer needs to satisfy the relationship of Hc1>Hc2 or Hc<Hc2.

The foregoing reference layer 15, nonmagnetic layer and magnetic-field adjusting layer 18 may be formed to have a synthetic anti-ferromagnet (SAF) structure. Specifically, ruthenium (Ru) is used as the material of the non-magnetic layer 17. Thus, the magnetization direction of the reference layer 15 and the magnetic-field adjusting layer 18 are coupled in anti-parallel using anti-ferromagnetic coupling.

Figure 7:
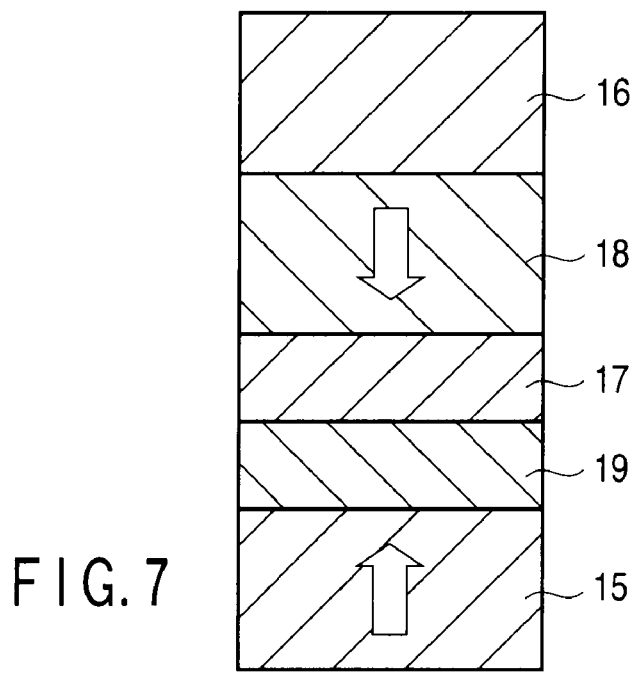
FIG. 7 is a cross-sectional view showing another structure of an MTJ element 10 according to the second embodiment.

As illustrated in FIG. 7, an anti-ferromagnetic layer 19 may be interposed between the non-magnetic layer 17 and the reference layer 15. Specifically, the anti-ferromagnetic layer 19 is provided on the reference layer 15, and the non-magnetic layer 17 is provided on the anti-ferromagnetic layer 19.

The anti-ferromagnetic layer 19 has a function of fixing the magnetization of the reference layer 15 in one direction. For example, alloys of manganese (Mn) and iron (Fe), Nickel (Ni), platinum (Pt), palladium (Pd), ruthenium (ru), osmium (Os) or iridium (Ir), that is, FeMn, NiMn, PtMn, PtPbMn, RuMn, OsMn and IrMn are usable as the anti-ferromagnetic layer 19.

As described above, according this embodiment, the magnetic-field adjusting layer 18 reduces a magnetic field leaking from the reference layer 15. This serves to reduce a shift of switching magnetic field of the recording layer 13 due to the leaked magnetic field. As a result, it is possible to reduce non-uniformity of switching magnetic field of the recording layer 13 between elements. In addition, the magnetic-field adjusting layer 18 and the anti-ferromagnetic layer 19 are used, and thereby, the magnetization of the reference layer 15 is fixed in one direction.

Third Embodiment

The third embodiment relates to the configuration of an MRAM configured using the MTJ element shown in the first or second embodiment.

Figure 8:
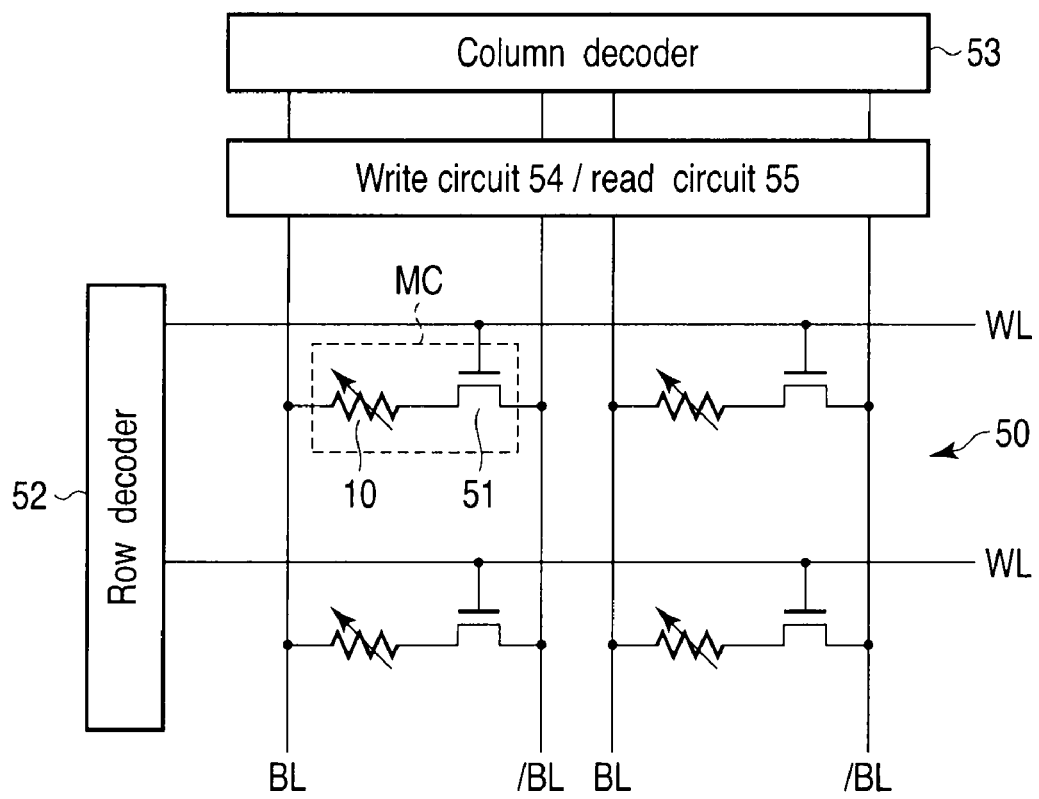
FIG. 8 is a circuit diagram showing the configuration of an MRAM according to the third embodiment.

FIG. 8 is a circuit diagram showing the configuration of an MRAM according to a third embodiment of the present invention. The MRAM includes a memory cell array 50 having a plurality of memory cells MC matrix-like arrayed. The memory array 50 is provided with a plurality of bit lines BL, /BL each extending in the column direction. The memory cell array 50 is further provided with a plurality of word lines WL each extending in the row direction.

The crossing portion of the bit line BL and the word line WL is provided with a memory cell MC. Each memory cell MC includes an MTJ element 10 and a select transistor 51 comprising an N-channel MOS transistor. One terminal of the MTJ element 10 is connected to the bit line BL. The other terminal of the MTJ element 10 is connected to a drain terminal of the select transistor 51. The gate terminal of the select transistor 51 is connected to the word line WL. A source terminal of the select transistor 51 is connected to the bit line /BL.

The word line WL is connected with a row decoder 52. A pair of bit lines BL and /BL are connected with a write circuit 54 and a read circuit 55. The write circuit 54 and the read circuit 55 are connected with a column decoder 53. Each memory cell MC is selected by the row decoder 52 and the column decoder 53.

A data write operation performed on the memory cell MC is carried out in the following manner. First, in order to select a memory cell MC executing data write, the word line WL connected to the memory cell MC is activated. In this way, the select transistor turns on.

The MTJ element 10 is supplied with a bidirectional write current Iw in accordance with the write data. Specifically, when the write current Iw from the left to the right is supplied to the MTJ element 10, the write circuit 54 applies a positive voltage to the bit line BL while applying a ground voltage to the bit line /BL. Conversely, when the write current Iw from the right to the left is supplied to the MTJ element 10, the write circuit 54 applies a positive voltage to the bit line /BL while applying a ground voltage to the bit line BL. In this way, data "0" or data "1" is written to the memory cell MC.

A data read operation performed on the memory cell MC is carried out in the following manner. First, the select transistor 51 of the selected memory cell MC turns on. The read circuit 55 supplies a read current Ir flowing from the right to the left to the MTJ element 10. Then, based on the read current Ir, the read circuit 55 detects a resistance value of the MTJ element 10. In this way, data stored in the MTJ element 10 can be read.

Figure 9:
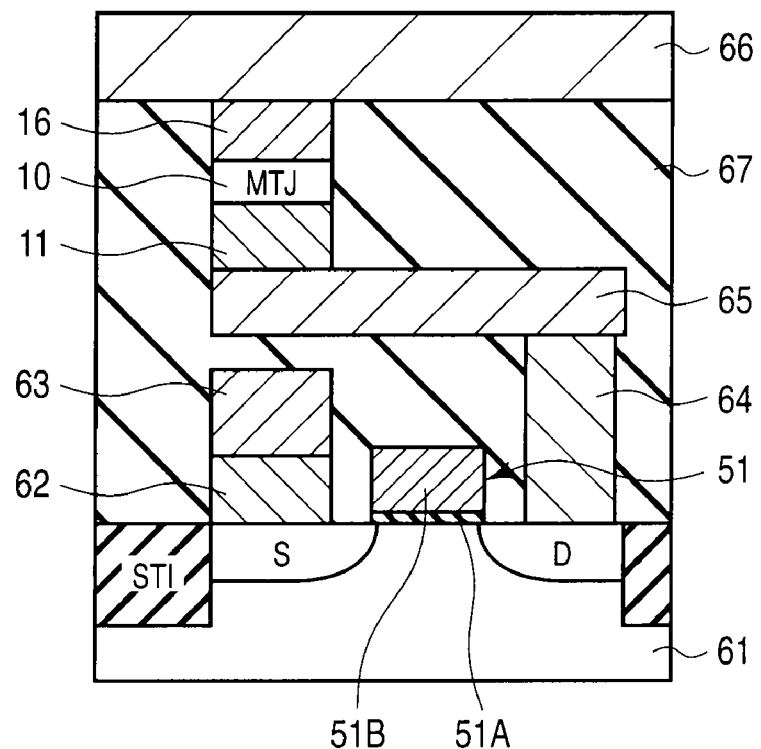
FIG. 9 is a cross-sectional view showing the structure of an MRAM to mainly explain one memory cell.

The structure of the MRAM will be described below. FIG. 9 is a cross-sectional view showing the structure of the MRAM to mainly explain one memory cell MC.

A surface area of a P-type semiconductor substrate 61 is formed with an isolation insulating layer. The surface area of the semiconductor substrate 61 unformed with the isolation insulating layer is an active area forming an element. The isolation insulating layer is formed of a shallow trench isolation (STI) layer. For example, a silicon oxide is used as the STI.

The active area of the semiconductor substrate 61 is formed with a source region S and a drain region D separating from each other. The source region S and the drain region D are each formed of an $N^+$ type diffusion region, which is formed by implanting a high-concentration $N^+$ type impurity. A gate electrode 51B is formed on the semiconductor substrate 61 between the source region S and the drain region D via a gate insulating film 51A. The gate electrode 51B functions as the word line WL. In this way, the semiconductor substrate 61 is provided with the select transistor 51.

An interconnect layer 63 is formed on the source region S via a contact 62. The interconnect layer 63 functions as a bit line /BL. A lead line 65 is formed above the drain region D via a contact 64. An MTJ element 10 held between bottom and top electrodes 11 and 16 is provided on the lead line 65. An interconnect layer 66 is provided on the top electrode 16. The interconnect layer 66 functions as the bit line BL. An interlayer insulating layer 67 consisting of a silicon oxide is filled between the semiconductor substrate 61 and the interconnect layer 66.

As described above, according to this embodiment, it is possible to provide an MRAM using the MTJ element 10 shown in the first or second embodiment. The MTJ element 10 is applicable to a domain wall displacement type magnetic memory in addition to the spin injection type magnetic memory.

The MRAM shown in the third embodiment is applicable to various apparatuses. The following are some application examples of the MRAM.

APPLICATION EXAMPLE 1

Figure 10:
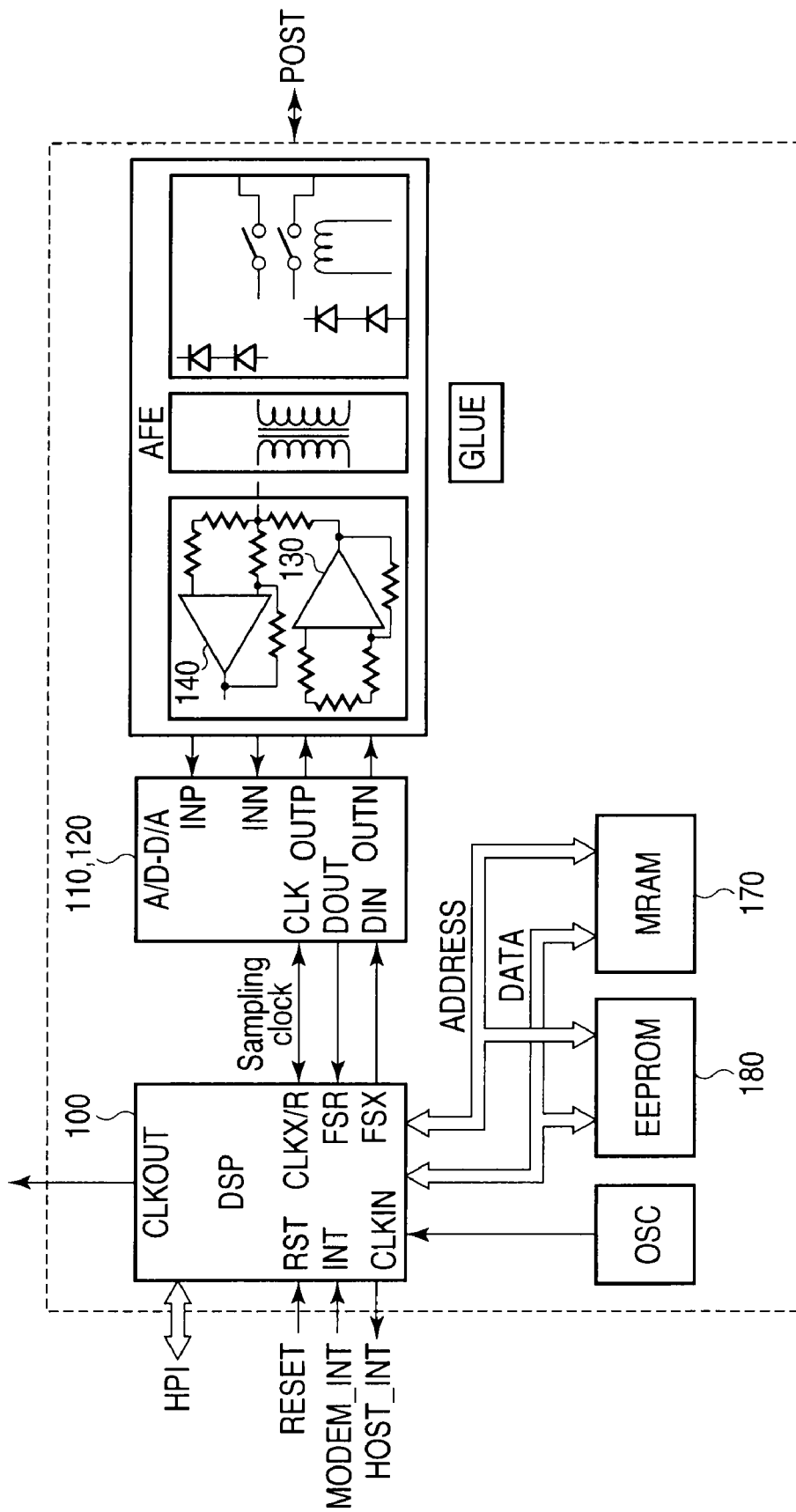
FIG. 10 is a block diagram showing the configuration of a DSL data path module for a digital subscriber line modem according to an application example 1 of the MRAM.

FIG. 10 shows a DSL data path module of a digital subscriber line (DSL) modem. The modem includes a programmable digital signal processor (DSP) 100, an analog-to-digital (A/D) converter 110, a digital-to-analog (D/A) converter 120, a transmission driver 130 and a receiver amplifier 140.

In FIG. 10, a band-pass filter is omitted, and an MRAM 170 of this embodiment and an EEPROM 180 are shown in place of the band-pass filter. The MRAM 170 and the EEPROM 180 are built in as various optional memories for holding a line code program (for selecting and operating a modem in accordance with coded subscriber line information, transmission conditions (line code: QAM, CAP, RSK, FM, AM, PAM, DWMT, etc., executed by the DSP).

According to application example 1, two memories, that is, the MRAM 170 and the EEPROM 180 are used as a memory for holding a line code program; however, the EEPROM 180 may be replaced with an MRAM, i.e., so that only the MRAM is used instead of using two memories.

APPLICATION EXAMPLE 2

Figure 11:
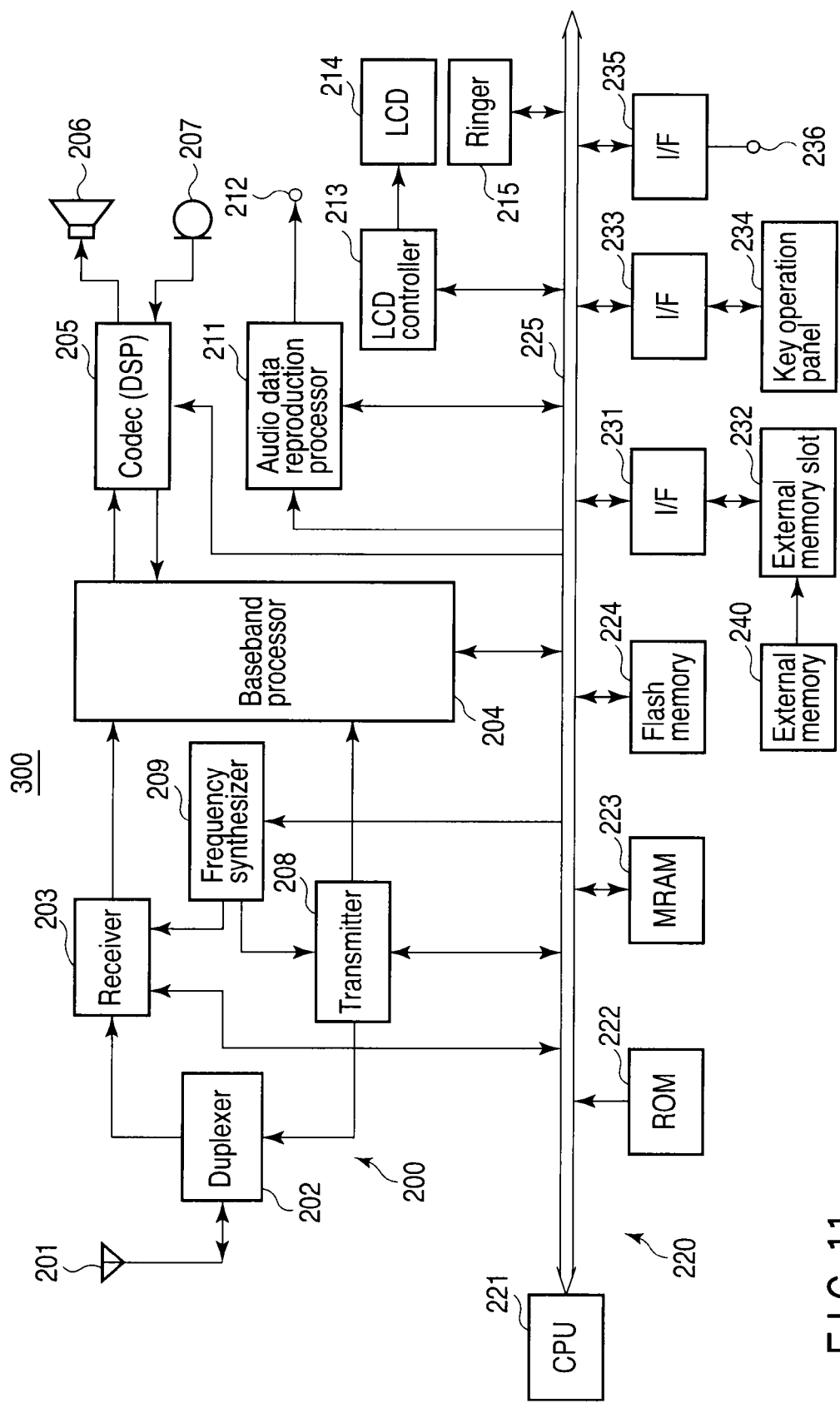
FIG. 11 is a block diagram showing the configuration of a mobile phone terminal 300 according to an application example 2 of the MRAM.

FIG. 11 shows another application example, that is, a mobile phone terminal 300. A communication unit 200 for realizing a communication function includes a transmission/reception antenna 201, a duplexer 202, a receiver 203, and a baseband processor 204. The communication unit 200 further includes a DSP 205 used as an audio codec, a speaker (receiver) 206, a microphone (mouthpiece) 207, a transmitter 208, and a frequency synthesizer 209.

The mobile phone terminal 300 is further provided with a controller 220 for controlling various components of the mobile phone terminal. The controller 220 is a microcomputer, which is configured so that a CPU 221, a ROM 222, an MRAM 223 of this embodiment and a flash memory 224 are connected via a bus 225. The foregoing ROM is previously stored with programs executed by the CPU 221 and necessary data such as display fonts.

The MRAM 223 is mainly used as a work area. Specifically, the MRAM 223 is used in the case of storing data during computing when the CPU 221 executes a program as the need arises, and temporarily storing exchange data between the controller 220 and various components. The flash memory 224 stores previous setting conditions even if the power of the mobile phone terminal is turned off. At the next power-on, the flash memory 224 stores setting parameters when the setting as above is used. In this way, even if the power of the mobile phone terminal 300 is turned off, the stored setting parameters are not lost.

The mobile phone terminal 300 is further provided with an audio reproduction processor 211, an external output terminal 121, a LCD controller 213, a display LCD (crystal liquid display) 214 and a ringer 215 for giving a call sound. The audio reproduction processor 211 reproduces audio information input to the mobile phone terminal 300 (or audio information stored in an external memory described latter). The reproduced audio information is transmitted to a headphone and a mobile speaker via the external output terminal. As described above, if the audio reproduction processor 211 is provided, audio information is reproducible. The LCD controller 213 receives display information from the CPU 221 via the bus 225, and converts it to LCD control information for controlling the LCD 214 to drive the LCD 214 for display.

The mobile phone terminal 300 is further provided with interface circuits (I/F) 231, 233, 235, an external memory 240, an external memory slot 232, a key operation panel 234 and an external input/output terminal 236. The foregoing external memory slot 232 is inserted with an external memory such as a memory card. The external memory slot 232 is connected to the bus 225 via the interface circuit (I/F) 231. As described above, the mobile phone terminal 300 is provided with the slot 232, and thereby, internal information of the terminal 300 is written to the external memory 240, or information (e.g., audio information) stored in the external memory 240 is input to the terminal 300.

The key operation panel 234 is connected to the bus 225 via the interface circuit (I/F) 233. Key input information input from the key operation panel is transmitted to the CPU 221, for example. The external input/output terminal 236 is connected to the bus 225 via the interface circuit (I/f) 233. Thus, the external input/output terminal 236 functions as a terminal, which inputs various information externally to the mobile phone terminal 300, or outputs information externally from the terminal 300.

According to this application example 2, the foregoing ROM 222, MRAM 223 and flash memory 224 are used. In this case, the flash memory 224 may be replaced with an MRAM, and further, the ROM may be replaced with an MRAM.

APPLICATION EXAMPLE 3

FIGS. 12 to 16 each show an example in which an MRAM is applied to a card (MRAM card) receiving media content, such as Smart Media.

Figure 12:
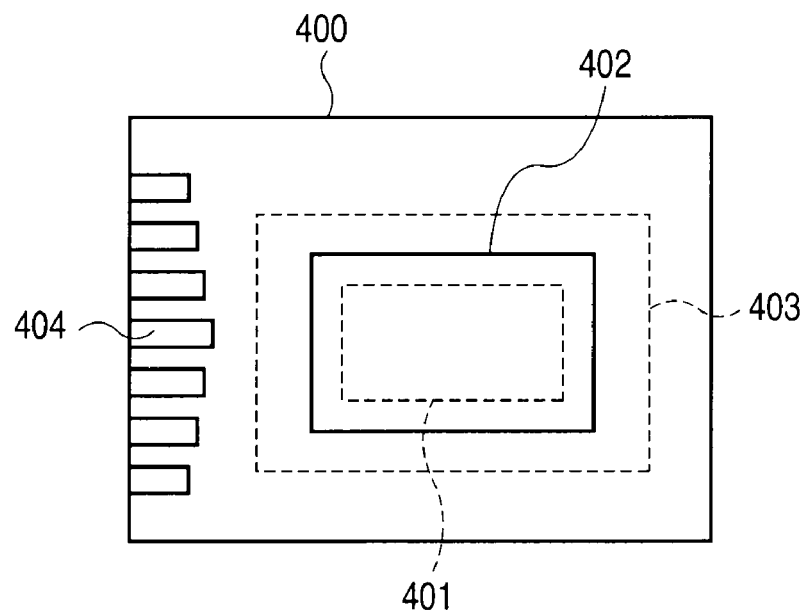
FIG. 12 is a top plan view showing an MRAM card 400 according to an application example 3 of the MRAM.

As shown in FIG. 12, an MRAM card body 400 has a built-in MRAM chip 401. The card body 400 is formed with an opening portion 402 at a position corresponding to the MRAM chip 401 so that the MRAM chip 401 is exposed. The opening portion 402 is provided with a shutter 403 so that the MRAM chip 401 is protected by the shutter 403 when the MRAM card is held by a user. The shutter 403 is formed of a material that shields against an external magnetic field, and is, for example, ceramic. Data transfer is performed when the shutter 403 is opened to expose the MRAM 401. An external terminal 404 is used for capturing content data stored in the MRAM card.

FIG. 13 and FIG. 14 are a top plan view and cross-sectional view showing a card-insert type transfer apparatus 500 for transferring data to the foregoing MRAM card.

A data transfer apparatus 500 has a receiver 500a. A first MRAM card 550 is inserted into the receiver 500a. The receiver 500a is provided with an external terminal 530 electrically connected with the first MRAM card 550. Data stored in the first MRAM card 550 is rewritten using the external terminal 530.

A second MRAM card 450 used by an end user is inserted to a slot 510 of the transfer apparatus 500 as shown by an arrow, and pushed in until the MRAM card 450 is stopped by a stopper 420. The stopper 520 functions as a member for aligning the first MRAM card 550 with the second MRAM card 450. When the second MRAM card 450 is arranged at a predetermined position, a first MRAM data rewrite controller supplies a control signal to the external terminal 530 so that data stored in the first MRAM card 550 is transferred to the second MRAM card 450.

Figure 15:
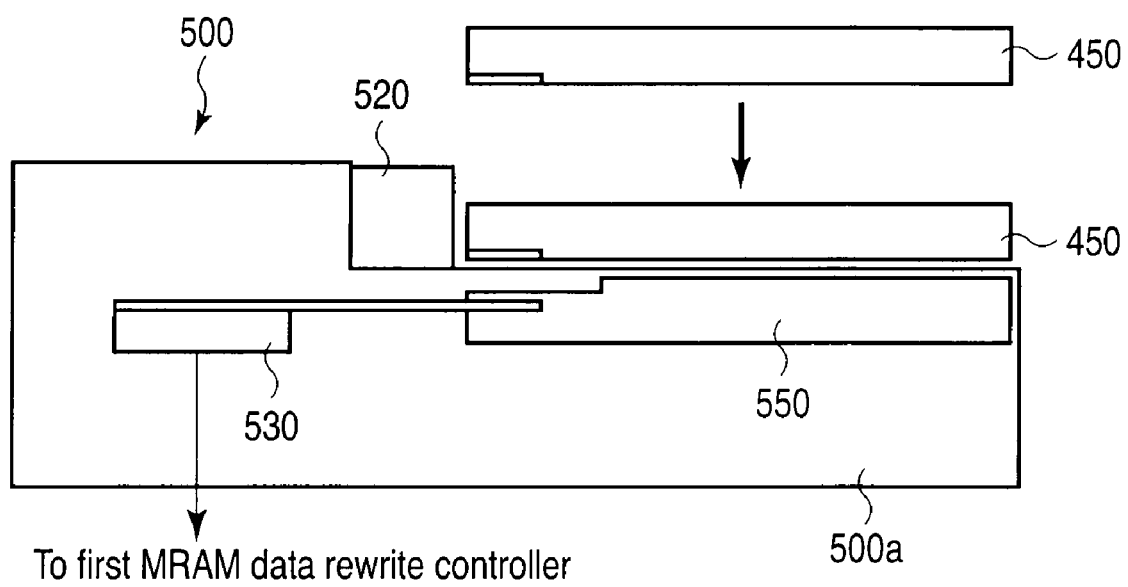
FIG. 15 is a cross-sectional view showing a fitting type transfer apparatus 500 for transferring data to an MRAM card.

FIG. 15 is a cross-sectional view showing a fitting type transfer apparatus 500. The transfer apparatus 500 is configured so that a second MRAM card 450 is fitted and placed on a first MRAM card 550 with respect to a stopper 520. The transfer method is the same as used in the card insert type; therefore, an explanation is omitted.

Figure 16:
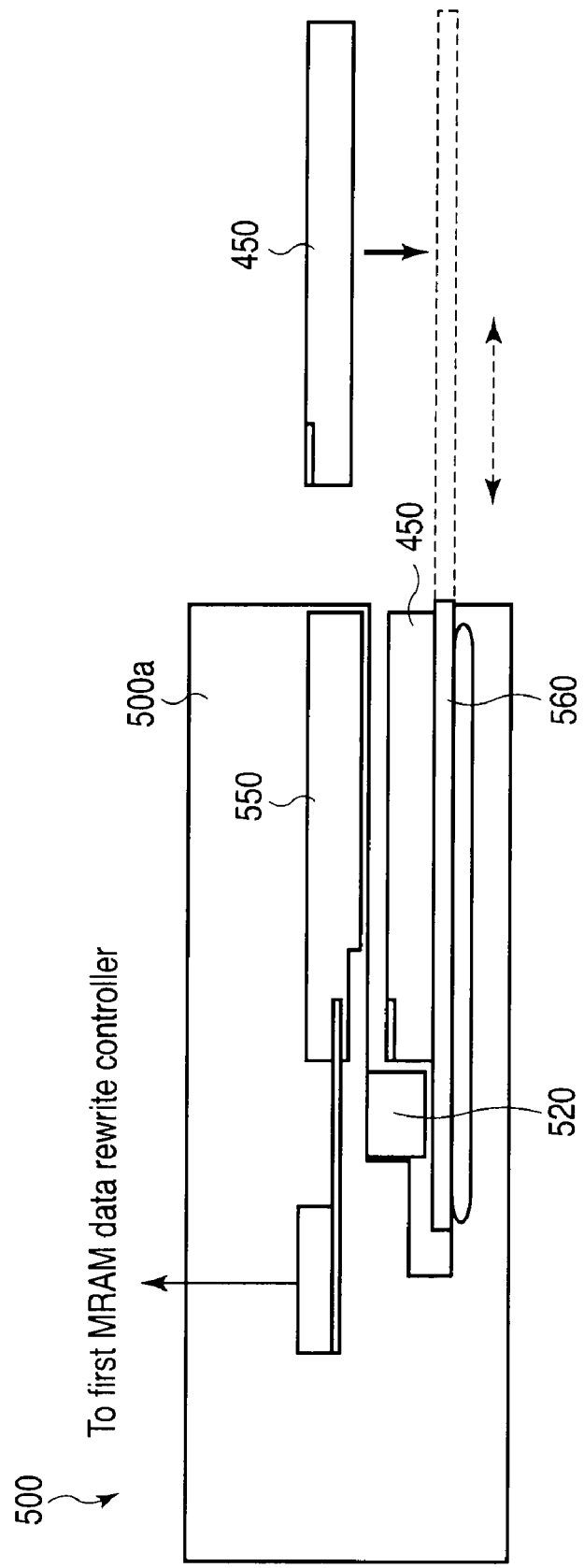
FIG. 16 is a cross-sectional view showing a slide-type transfer apparatus 500 for transferring data to an MRAM card.

FIG. 16 I a cross-sectional view showing a slide type transfer apparatus. The transfer apparatus 500 is provided with a receiver slide 560, such as is used in a CD-ROM drive and DVD drive. The receiver slide 560 is moved as shown by arrows. When the receiver slide 560 is moved to a position shown by a broken line, the second MRAM card 450 is placed on the receiver slide 560, and then, loaded into the transfer apparatus 500. The distal end portion of the second MRAM card 450 is carried so that it abuts with a stopper 520. This and the transfer method are the same as the card insert type, and therefore, an explanation is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a first underlying layer having a cubic or tetragonal crystal structure oriented in a (001) plane;
a first magnetic layer provided on the first underlying layer, having magnetic anisotropy perpendicular to a film surface, and having a face-centered tetragonal (fct) structure oriented in a (001) plane;
a first non-magnetic layer provided on the first magnetic layer; and
a second magnetic layer provided on the first non-magnetic layer, and having magnetic anisotropy perpendicular to a film surface,
an in-plane lattice constant a1 of the first underlying layer and an in-plane lattice constant a2 of the first magnetic layer satisfying the following equation in which b is a magnitude of Burgers vector of the first magnetic layer, v is an elastic modulus of the first magnetic layer, and hc is a thickness of the first magnetic layer, $$|\sqrt{2} \times a1/2 - a2|/a2 < b \times \{\ln(hc/b)+1\}/\{2\pi \times hc \times (1+v)\}.$$

2. The element according to claim 1, wherein the first underlying layer has an NaCl structure, and includes one of:
a nitride containing La;
an oxide containing Ba;
a sulfide containing one or more elements of Gd, Tb, Dy, Ho, Er and Tm; and
a selenide containing one or more elements of Cd, Mg, Mn and Er.

3. The element according to claim 1, wherein the first underlying layer has a fluorite structure, and includes an oxide containing Ce or Na.

4. The element according to claim 1, further comprising a second underlying layer provided under the first underlying layer, and having an amorphous structure or micro crystal structure.

5. The element according to claim 4, wherein the second underlying layer includes:
a metal containing one or more elements of Fe, Co and Ni, and one or more elements of B, Nb, Si, Ta and Zr; or
a material containing the metal and an oxide film of the metal formed on the metal.

6. The element according to claim 4, further comprising a third underlying layer interposed between the first and second underlying layers, and having an NaCl structure.

7. The element according to claim 6, wherein the third underlying layer includes an oxide containing one or more elements of Mg, Ca, Ba, Ti, V, Nb, Mn, Fe, Co and Ni.

8. The element according to claim 4, further comprising a third underlying layer interposed between the first and second underlying layers, and including a metal containing one or more elements of Ir, Al, Au, Pd, Pt, Ag, Fe, Cr and V.

9. The element according to claim 1, wherein the first magnetic layer has one of an $L1_0$ structure, $L1_2$ structure and a mixed structure of those.

10. The element according to claim 1, wherein the first magnetic layer includes an alloy containing one or more elements of Fe, Co, Ni and Mn, and one or more elements of Pt, Pd, Rh, Al and Au.

11. The element according to claim 1, further comprising:
a second non-magnetic layer provided on the second magnetic layer; and
a magnetic-field adjusting layer provided on the second non-magnetic layer, and reducing a leak magnetic field from the second magnetic layer.

12. The element according to claim 11, wherein the second magnetic layer and the adjusting layer are anti-ferromagnetically coupled.

13. A magnetoresistive element comprising:
a first underlying layer having a perovskite structure oriented in a (001) plane;
a first magnetic layer provided on the first underlying layer, and having magnetic anisotropy perpendicular to a film surface, and having an fct structure oriented in a (001) plane;
a first non-magnetic layer provided on the first magnetic layer; and a second magnetic layer provided on the first non-magnetic layer, and having magnetic anisotropy perpendicular to a film surface, an in-plane lattice constant a1 of the first underlying layer and an in-plane lattice constant a2 of the first magnetic layer satisfying the following equation in which b is a magnitude of Burgers vector of the first magnetic layer, v is an elastic modulus of the first magnetic layer, and hc is a thickness of the first magnetic layer, $$|a1-a2|/a2 < b \times \{\ln(hc/b)+1\}/\{2\pi \times hc \times (1+v)\}.$$

14. The element according to claim 13, wherein the first underlying layer includes an oxide containing one or more elements of Sr, Ce, Dy, La, K, Pb, Ca and Ba.

15. The element according to claim 13, further comprising a second underlying layer provided under the first underlying layer, and having an amorphous structure or micro crystal structure.

16. The element according to claim 15, wherein the second underlying layer includes:
a metal containing one or more elements of Fe, Co and Ni, and one or more elements of B, Nb, Si, Ta and Zr; or
a material containing the metal and an oxide film of the metal formed on the metal.

17. The element according to claim 15, further comprising a third underlying layer interposed between the first and second underlying layers, and having an NaCl structure.

18. The element according to claim 17, wherein the third underlying layer includes an oxide containing one or more elements of Mg, Ca, Ba, Ti, V, Nb, Mn, Fe, Co and Ni.

19. The element according to claim 15, further comprising a third underlying layer interposed between the first and second underlying layers, and including a metal containing one or more elements of Ir, Al, Au, Pd, Pt, Ag, Fe, Cr and V.

20. The element according to claim 13, wherein the first magnetic layer has one of an $L1_0$ structure, $L1_2$ structure and a mixed structure of those.

21. The element according to claim 13, wherein the first magnetic layer includes an alloy containing one or more elements of Fe, Co, Ni and Mn, and one or more elements of Pt, Pd, Rh, Al and Au.

22. The element according to claim 13, further comprising:
a second non-magnetic layer provided on the second magnetic layer; and
a magnetic-field adjusting layer provided on the second non-magnetic layer, and reducing a leak magnetic field from the second magnetic layer.

23. A magnetic memory comprising a memory cell including a magnetoresistive element, and first and second electrodes sandwiching the magnetoresistive element to supply a current to the magnetoresistive element, the magnetoresistive element comprising:
a first underlying layer having a cubic or tetragonal crystal structure oriented in a (001) plane;
a first magnetic layer provided on the first underlying layer, having magnetic anisotropy perpendicular to a film surface, and having an fct structure oriented in a (001) plane;
a first non-magnetic layer provided on the first magnetic layer; and
a second magnetic layer provided on the first non-magnetic layer, and having magnetic anisotropy perpendicular to a film surface,
an in-plane lattice constant a1 of the first underlying layer and an in-plane lattice constant a2 of the first magnetic layer satisfying the following equation in which b is a magnitude of Burgers vector of the first magnetic layer, v is an elastic modulus of the first magnetic layer, and hc is a thickness of the first magnetic layer, $$|\sqrt{2} \times a1/2 - a2|/a2 < b \times \{\ln(hc/b)+1\}/\{2\pi \times hc \times (1+v)\}.$$

24. The memory according to claim 23, further comprising:
a first interconnect electrically connected to the first electrode;
a second interconnect electrically connected to the second electrode; and
a write circuit electrically connected to the first and second interconnects, and bidirectionally supplying a current to the magnetoresistive element.

25. The memory according to claim 24, wherein the memory cell includes a select transistor electrically connected between the second electrode and the second interconnect.

* * * * *